US011610105B2

(12) United States Patent
Kumar et al.

(10) Patent No.: US 11,610,105 B2
(45) Date of Patent: Mar. 21, 2023

(54) SYSTEMS AND METHODS FOR HARNESSING ANALOG NOISE IN EFFICIENT OPTIMIZATION PROBLEM ACCELERATORS

(71) Applicant: Hewlett Packard Enterprise Development LP, Houston, TX (US)

(72) Inventors: Suhas Kumar, Palo Alto, CA (US); Thomas Van Vaerenbergh, Palo Alto, CA (US); John Paul Strachan, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 593 days.

(21) Appl. No.: 16/386,849

(22) Filed: Apr. 17, 2019

(65) Prior Publication Data

US 2020/0334523 A1 Oct. 22, 2020

(51) Int. Cl.
| G06N 3/06 | (2006.01) |
| G06N 3/04 | (2006.01) |
| G06N 3/063 | (2023.01) |
| G11C 13/00 | (2006.01) |
| H03K 3/0233 | (2006.01) |

(52) U.S. Cl.
CPC ......... G06N 3/0635 (2013.01); G06N 3/0445 (2013.01); G11C 13/004 (2013.01); H03K 3/02337 (2013.01)

(58) Field of Classification Search
CPC .. G06N 3/0635; G06N 3/0445; G11C 13/004; H03K 3/02337
See application file for complete search history.

(56) References Cited

U.S. PATENT DOCUMENTS

| 6,043,695 A | 3/2000 | O'Sullivan |
| 9,929,724 B2 | 3/2018 | Rajagopal et al. |
| | (Continued) | |

FOREIGN PATENT DOCUMENTS

WO WO-2017155544 A1 * 9/2017 ............. G11C 11/54

OTHER PUBLICATIONS

Xia et al., "Memristive Crossbar Arrays for Brain-Inspired Computing", Nature Materials, Apr. 2, 2019, pp. 309-323 (Year: 2019).*

(Continued)

*Primary Examiner* — Paulinho E Smith
(74) *Attorney, Agent, or Firm* — Sheppard Mullin Richter & Hampton LLP

(57) ABSTRACT

Systems and methods are provided for implementing a hardware accelerator. The hardware accelerator emulates a neural network, and includes a memristor crossbar array, and a non-linear filter. The memristor crossbar array can be programmed to calculate node values of the neural network. The nodes values can be calculated in accordance with rules to reduce an energy function associated with the neural network. The non-linear filter is coupled to the memristor crossbar array and programmed to harness noise signals that may be present in analog circuitry of the hardware accelerator. The noise signals can be harnessed such that the energy function associated with the neural network converges towards a global minimum and modifies the calculated node values. In some embodiments, the non-liner filter is implemented as a Schmidt trigger comparator.

20 Claims, 6 Drawing Sheets

(56) References Cited

U.S. PATENT DOCUMENTS

| | | |
|---|---|---|
| 10,026,474 B2 | 7/2018 | Buchanan |
| 2017/0004398 A1* | 1/2017 | Chen .................... G06N 3/0635 |
| 2018/0114569 A1* | 4/2018 | Strachan ............. G11C 7/1012 |
| 2018/0166134 A1 | 6/2018 | Zidan et al. |
| 2020/0192598 A1* | 6/2020 | Kumar ................. G06N 3/0635 |
| 2020/0218967 A1* | 7/2020 | Strachan ............. G06N 3/0635 |
| 2021/0151486 A1* | 5/2021 | Kobayashi ........ H01L 27/14643 |

OTHER PUBLICATIONS

Yulhwa Kim et al., "Input-splitting of Large Neural Networks for Power-efficient Accelerator with Resistive Crossbar Memory Array," May 30, 2018, pp. 1-6, Pohang University of Science and Technology, Korea.

Yuriy V. Pershin and Massimiliano Di Ventra, "Practical Approach to Programmable Analog Circuits with Memristors," Jul. 17, 2010, pp. 1-8, Available at: <arxiv.org/pdf/0908.3162.pdf>.

\* cited by examiner

SYSTEMS AND METHODS FOR HARNESSING ANALOG NOISE IN EFFICIENT OPTIMIZATION PROBLEM ACCELERATORS

DESCRIPTION OF RELATED ART

Artificial neural networks are a family of technical models based on biological nervous systems, which are used to estimate or approximate functions that depend on a large number of inputs. Neural networks may be represented as a system of interconnected "neurons" which exchange messages between each other. The connections may have numerical weights that can be tuned based on experience, making neural networks adaptive to inputs and capable of machine learning. Artificial neural networks may have a variety of applications, including function approximation, classification, data processing, robotics, and computer numerical control.

There may be various types of neural networks, including feedforward neural networks, radial basis function neural networks, recurrent neural networks, and other types. As a general description, Hopfield Neural Networks (HNNs) are a type of artificial neural network that involve computed iterative steps based on energy minimizing rules. The recurrent, or feedback characteristics of HNNs may be particularly suitable for implementing logic operations, solving optimization problems, performing analog-digital conversion, and implementing associative memories (e.g., content-addressable memories), for example. However, in some cases, models based on HNNs may experience limitations due to its computational properties. For instance, a Hopfield based system may converge at local minima of its energy function, which causes the computation to end without reaching a global minimum. This scenario has a high probability of occurring in HNN implementations, and may be problematic, as it is the global minimum of the network's energy function that typically produces optimal values, or most correct solution. Stabilization at local minima is a common drawback associated with HNNs (due to its energy minimizing properties), which affects the accuracy of its computations and serves as a deterrent from the widespread use of HNNs in various applications.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
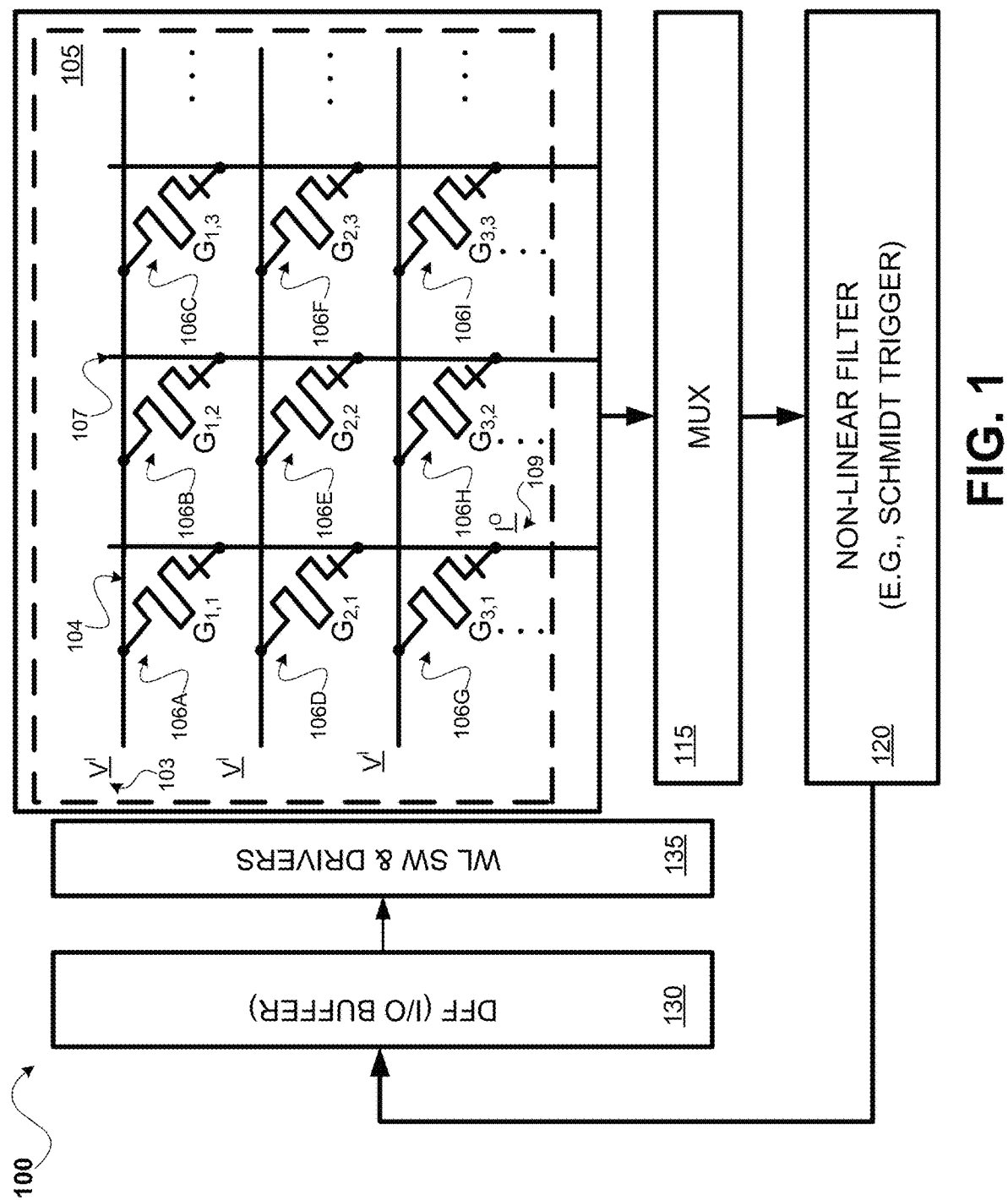
FIG. 1 depicts an example of a hardware accelerator system for calculating node values of a neural network, including a non-linear filter for harnessing noise of the emulated neural network, according to some embodiments.

The figures are not exhaustive and do not limit the present disclosure to the precise form disclosed.

DETAILED DESCRIPTION

Various embodiments described herein are directed to hardware configured to emulate a logical neural network. Furthermore, the hardware has been adapted to include circuitry, such as a non-liner filter, that is designed for harnessing noise from the analog hardware of the emulated neural network for optimized performance. Analog circuits characteristically have some level of noise present. As referred to herein, noise may be generally described as an unintendedly generated electrical signal. As an example, intrinsic noise is generated within an analog circuit from a variety of sources, such as the signal paths, or the components themselves. There are mechanisms that exist to reduce noise in analog circuits, for instance filters for reducing noise to a level that does not significantly impact characteristics or measurements of the desired electrical signals. Nonetheless, there is some noise that may be irreducible that remains present in the circuit, since intrinsic noise can be a fundamental physical property of analog circuits (e.g., due to the random thermal movement of particles). The embodiments leverage noise that may be present in the analog circuitry of the hardware accelerator to improve its performance, as opposed to many current techniques that aim to remove noise to realize improvements. As described herein, the hardware accelerator is designed to harness noise, that is often times intrinsically present in analog circuits, using hardware-driven annealing techniques, thereby enhancing accuracy of its computations. In addition to improving computational capabilities, the noise harnessing techniques disclosed may realize a robust design that is resilient to increased noise levels (as compared to some existing analog array circuits).

Memristors are devices that may be used as components in a wide range of electronic circuits, such as memories, switches, radio frequency circuits, and logic circuits and systems. In a memory structure, a crossbar array of memory devices having memristors may be used. In memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on". Furthermore, memristors may also behave as an analog component with variable conductance.

In some applications, a memory crossbar array can be used to perform vector-matrix computations. For example, an input voltage signal from each row line of the crossbar is weighted by the conductance of the resistive devices in each column line and accumulated as the current output from each column line. Ideally, if wire resistances can be ignored, the current (I) flowing out of the crossbar array will be approximately represented in the equation below:

$$I^T = V^T G \qquad (1)$$

where V is the input voltage and G is the conductance matrix.

The memristor crossbar array is configured to include contributions from each memristor in the crossbar array. The use of memristors at junctions or cross-points of the crossbar array enables programming the resistance (or conductance) at each such junction.

Examples disclosed herein include hardware accelerators for calculating node values for neural networks. Example hardware accelerators may include a memristor crossbar array programmed to calculate node values. Memory cells of the memristor crossbar array may be programmed according to a weight matrix. Driving input voltages mapped from an input vector through the memristor crossbar array may produce output current values which may be compared to a threshold current to generate a new input vector of new node values. In this manner, example accelerators herein provide for hardware calculations of node values for neural networks.

Referring now to the drawings, FIG. 1 illustrates an example hardware accelerator 100 according to the embodiments. Hardware accelerator 100 may be a hardware unit configured for calculating node values for neural networks. Hardware accelerator 100 may calculate new node values of a neural network by transforming an input vector in relation to a weight matrix. Hardware accelerator 100 may do so by calculating a vector-matrix multiplication of the input vector with the weight matrix.

In the example illustrated in FIG. 1, a Hopfield Neural Network (HNN) is particularly implemented by the hardware accelerator 100 described herein. FIG. 1 shows an implementation of the example hardware accelerator 100 having various components, including: a memristor crossbar array structure 101; multiplexer (MUX) 115; non-linear filter 120; delay flip-flop (DFF) (I/O Buffer) 130; and drivers 135. Memristor crossbar array 105 can be configured to implement the weight matrix aspects of the HNN, as described above. As a general principle of analog crossbars, larger crossbar arrays typically have the capacity to perform more computations in parallel. Also, dedicating more of the circuit for the hardware accelerator 100 to implement the crossbar array 105 (e.g., larger crossbar array structure) may amortize the costs of the peripheral circuitry, which dominate the power and area consumption. Despite these benefits, larger crossbar arrays can also generate more noise in the circuit, due to the increased number of analog crossbars used, which further leads to noise in the computation results. Thus, there may be a design trade-off for hardware accelerators with respect to the amount of noise that can be handled by the circuit, and its overall computational power. For example, some existing approaches implement smaller arrays as a brute force solution to mitigate the effects of noise. In contrast, the embodiments harness noise in such a way that may yield better computing results when more noise is present in the circuitry. Accordingly, the disclosed hardware accelerator 100 has a design that can increase its power efficiency by allowing a larger analog crossbar array implementation. As an example, the crossbar array 105 can be implemented using a 1024×1024 (M×N) array rather than a 100×100 used in some implementations. The non-linear filter 120 can be configured for implementing the noise harnessing aspects of the HNN, as further described in herein. Thus, the disclosed techniques can realize performance enhancements by adding relative simple post-processing circuitry to the hardware accelerator. Therefore, the embodiments can realize cost and redundancy advantages over some approaches that utilize costly error-correcting codes to address the impacts of noise.

Figure 4:
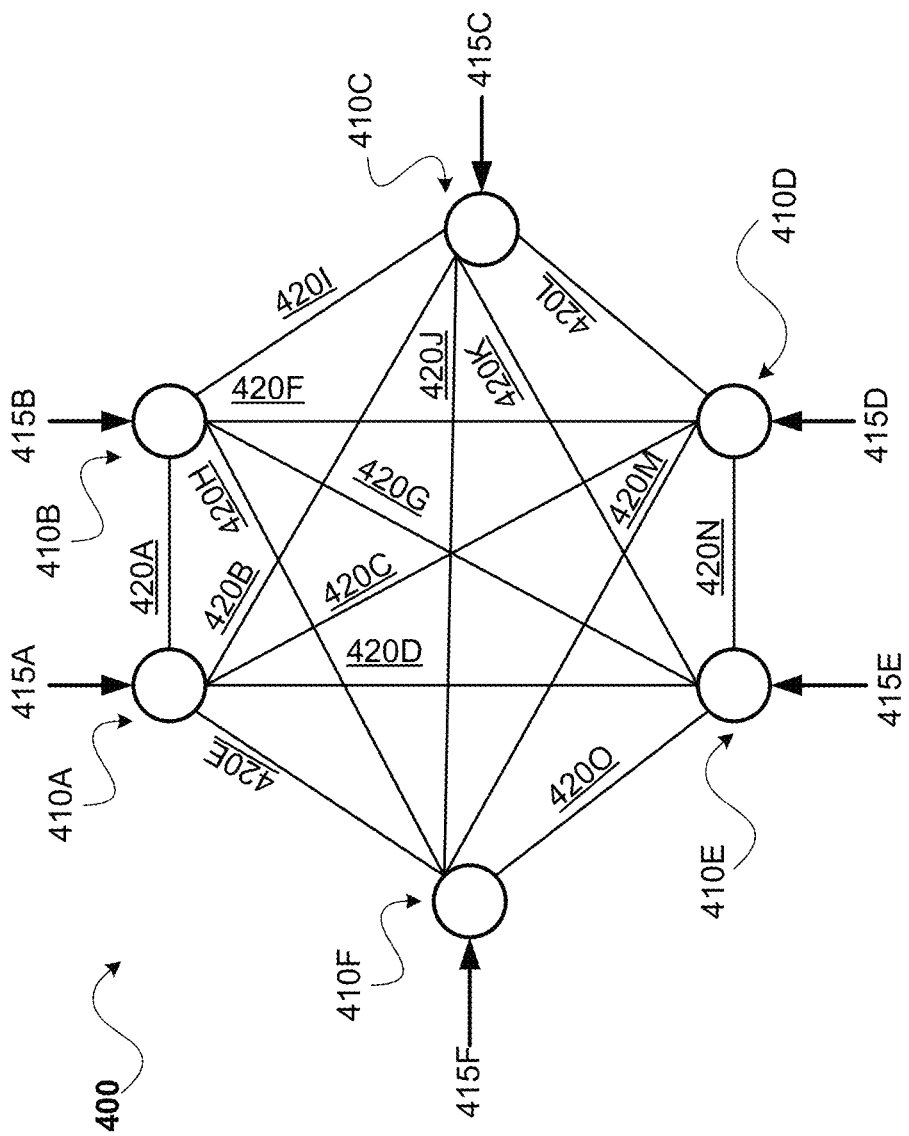
FIG. 4 depicts a conceptual model illustrating an example neural network.

As previously described, HNNs are a type of artificial neural network that can be used as a computational mechanism for various applications. A model of an HNN is conceptually illustrated in FIG. 4. Graphically, an HNN as a mathematical construct can be represented as graph 400 of a bidirectional (undirected) network with nodes ($s_i$) 410A-410F and edges ($w_{ij}$) 420A-420O. Edges 420A-420O can be formed between each of the nodes 410A-410F. A computational "problem" can be encoded (or trained) in the edge weights and a threshold function. Input node values 415A-415F can be delivered to the nodes 410A-410F until the computational "answer" to the problem is determined by a final state for the node values. In this manner, an HNN can be a dynamic system, and the node values can evolve based on the edge weightings to all the other node values (e.g., as a dot product operation). The dynamics follow energy minimizing rules, such that the "energy" of the system does not increase, and thus can find a minimum. The final configuration of the nodes encodes the solution. Therefore the "energy" indicates whether the network is modified when an update occurs, and the system reaches its minimum energy when it becomes stable.

The HNN can be "trained" to a set of distinct inputs. As alluded to above, HNNs can employ update rules that minimize a network's energy function (e.g., only reducing energy at each successive update). It should be also be understood that in some cases, inputs are used as initial conditions, and the HNN is allowed to evolve to a rest state (e.g., without training by changing the weights). For example, an energy function of an HNN may be represented as the equation below:

$$E = -\tfrac{1}{2} \Sigma_{i,j} w_{ij} s_i s_j + \Sigma_i \theta_i s_i \qquad (2)$$

Figure 3:
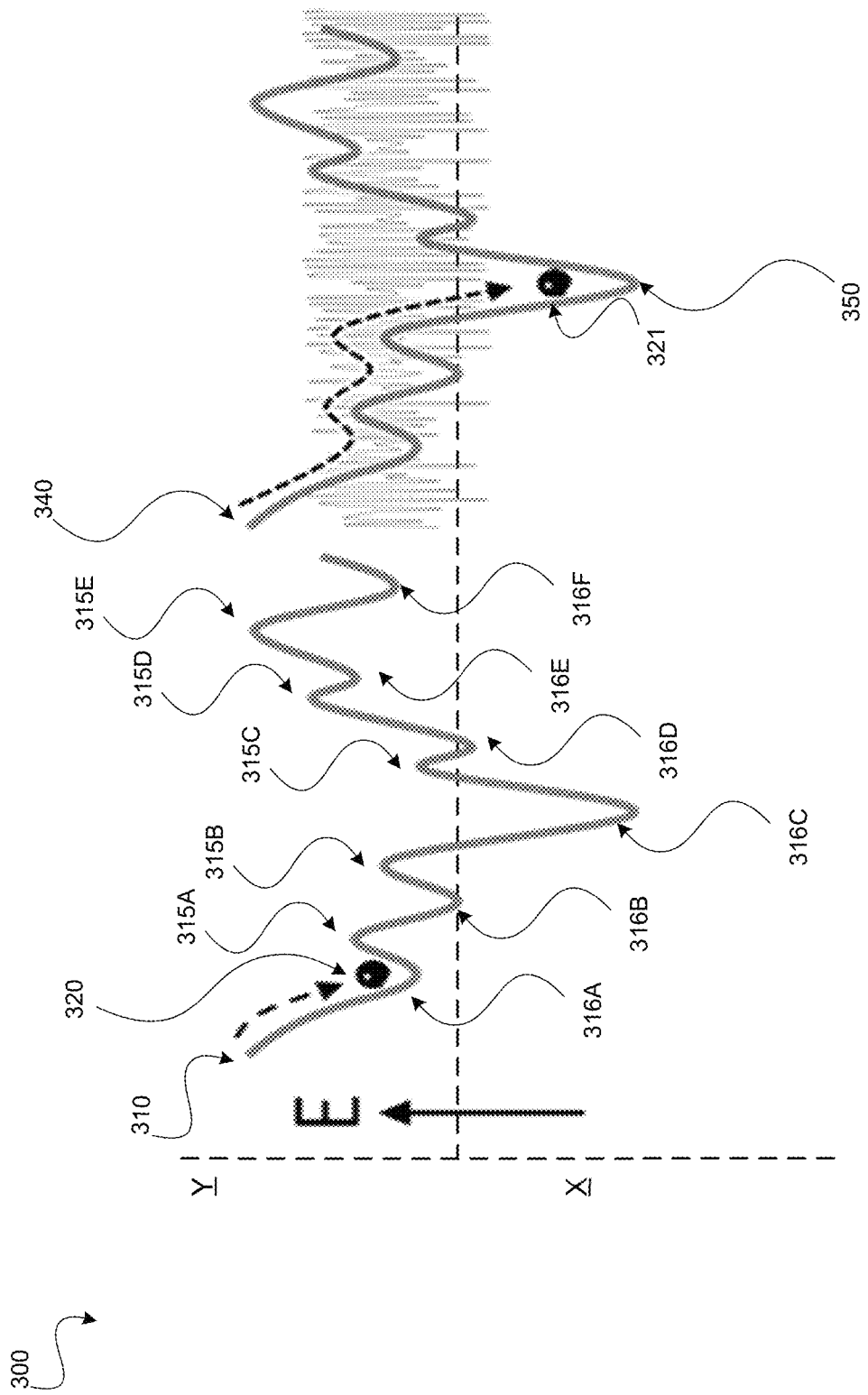
FIG. 3 is a graphical representation of an energy function associated with a neural network including a conceptually diagramed harnessing of noise of the circuitry, according to some embodiments.

Referring now to FIG. 3, an example of a graphical representation of an energy function associated with an HNN is illustrated. It should be appreciated that FIG. 3 depicts the energy function corresponding to the HNN as a continuous function, whereas different implementations of an HNN can also correspond to a system with a discrete state energy function. As seen, an energy function can be represented as wave 310 being substantially sinusoidal in form, where an energy value for the HNN at a particular state corresponds to the vertical position (e.g., height) of the wave 310 along the y-axis of the graph (with respect to the x-y axis represented by dashed lines). The energy function of the HNN transitions from initial states (e.g., start of a set of inputs) having higher energy levels, illustrated as higher points 315A-315E of wave 310 with amplitudes in the (+) y direction (with respect to the x-y axis represented by dashed lines). In between each of the higher energy states, the network propagates through subsequent states having lower energy and eventually reaches a state with minimal energy. The minimal energy states are illustrated as lower points 316A-316F on wave 310 with an amplitude in the (−) y direction. Accordingly, node values calculated by the HNN also evolve towards energy minima, or the computational answer. Each set of inputs into the HNN can converge to its own answer, which corresponds to a respective minimum energy for that set on the energy graph, also referred to as local minima. Referring to FIG. 3, updates to the evolving node values of the HNN are represented by ball 320. The position of the ball 320 along wave 310 corresponds to the system's energy, which impacts the node values calculated for that particular state. Thus, the HNN reaching a local minimum for a set of inputs can be represented on the energy graph by ball 320 being positioned at one of the low points 316A-316F on wave 310. For purposes of illustration, the local minima phenomena can generally be described in the energy graph as ball 320 resting in a valley. Each valley, or low point 316A-316F, produces respective node values that can be considered a computational answer. As such, an HNN has the potential to converge at any of the multiple "answers" (having an energy that becomes stable at any of the points 316A-316F on the graph) based on the received input.

A global minimum can be characterized as the optimally minimized energy of the HNN across multiple sets of inputs. Consequently, it is the global minimum (or global convergence) that represents the most accurate calculation by the HNN. In FIG. 3, as each of the low points 316A-316F represents local minima for the energy function, the global minimum can be represented by the lowest point of wave 310 on the energy graph, or low point 316C. Restated, although the local minima of the energy function correspond to multiple potential computational answers, node values generated by the state at global minimum can be the optimal answer. As previously described, models based on HNN may experience limitations due to its computational properties. For instance, a system can stabilize at local minima (e.g., false solution to a problem) of the energy function. Referring back to the example, ball 320 may settle in one of the valleys at lower points 316A, 316B, 316D-316F in the energy graph. In order for the ball 320 to escape a valley, energy can be injected into the system to allow ball 320 to reach a higher energy level, climbing an upward slope to approach one of the higher points 315A-315E. However, as described above, HNNs characteristically do not increase its energy function. Consequently, in the event that the HNN stops evolving at local minima, then the system may be stuck at that state. The energy minimizing rule of HNNs may prevent ball 320 from escaping the valley, in turn preventing the system from ultimately reaching the global minimum (e.g., correct solution to a problem). As a result, hardware implementations of HNNs can also suffer from the negative impacts of local minima. The embodiments address local minima constraints by adapting the hardware accelerator 100 in FIG. 1, which emulates an HNN, to leverage noise generated by analog circuitry in a way that simulates injecting external energy into the energy graph of an HNN.

Referring again to the example discussed in reference to FIG. 3, noise that may generated intrinsically by the memristor crossbar array 105 (shown in FIG. 1) can act as noise being injected into the system. FIG. 3 illustrates another wave 340 that can be associated with an energy function for a neural network. In this case, the energy function of wave 340 may lend itself for having ball 321 rest in a local minima, similar to the example including wave 310. However, the system with wave 340 is shown as having a noise signal 350 present. As previously described, the noise signal 350 which may impact the energy of the system. For instance, noise signal 350 may introduce an amount of energy needed to excite the ball 321 enough to escape the valley, or local minima. Accordingly, the presence of noise can considered a resource that may be harnessed to achieve faster convergence and improved accuracy of the HNN. Furthermore, the disclosed systems and techniques may be particularly beneficial for the various applications of HNNs. As referred to herein, simulated annealing refers to a hardware-driven approach for emulating excitation with respect to a neural network's energy function to escape local minimum, and converge towards global minimum.

Moreover, an aspect of simulated annealing includes adjusting an amplitude of the noise signal 350 to achieve optimal results. As an example, more noise may be needed initially for enough excitation to jump out of local minima. Eventually, once global minima is reached, the need for the hill-climbing features of added noise is no longer needed. Even further, too much noise in the system at global minimum potentially prevents the system from quickly converging. Thus, a small amount of noise, or no noise, is more desirable in the global minima state. In some embodiments, the non-linear filter 120 (shown in FIG. 1) can adjust over time, so that an amount of noise that is tolerated before the computations are substantially impacted can gradually increase. As such, the circuitry is adapted to simulate annealing, where the noise signal 350 is initially large for escaping local minima, and then has a gradually smaller amplitude approaching the global minima point 315C.

The embodiments provide an efficient and hardware-driven solution, which realizes advantages over some existing approaches to address local minima associated with HNNs. For instance, quantum annealing is a known technique to mitigate local minima. Nonetheless, quantum annealing is a temperature-dependent solution, where the environment is controlled for cooling. The lower temperatures induce particles to initially lose energy, and subsequently pull energy from the environment to assume a higher energy state (thus avoiding local minima of the energy function). In the case of hardware implemented HNNs, cryogenic temperatures are used to achieve cooling of the circuits. Thus, quantum annealing often involves high energy consumption and system inefficiency. Furthermore, there is uncertainty regarding whether advancements in quantum annealing will be successful without requiring cooling. The embodiments integrate local minima escaping mechanisms into the HNN emulating circuitry itself, therefore reducing costs and providing an alternative to the other environmental control concerns of other approaches, such as quantum annealing.

Referring back to FIG. 1, hardware accelerator 100 can include memristor crossbar array 105 and peripheral circuitry. Memristor crossbar array 105 can be a configuration of parallel and perpendicular lines with memory cells coupled between lines at intersections. Memristor crossbar array 105 may include a plurality of row lines 104, a plurality of column lines 106, and a plurality of memory cells 106A-106I. Each of the memory cells 106A-106I may be coupled between each unique combination of one row line 104 and one column line 106. In other words, none of the memory cells 106A-106I share both a row line 104 and a column line 107.

Row lines 104 may be electrodes that carry current through memristor crossbar array 105. In some examples, row lines 104 may be parallel to each other, generally with equal spacing. Row lines 104 may sometimes be, for example, a top electrode or a word line. Similarly, column lines 106 may be electrodes that run nonparallel to row lines 104. Column lines 106 may sometimes be, for example, a bottom electrode or bit line. Row lines 104 and column lines 106 may serve as electrodes that deliver voltage and current to the memory cells 106A-106I. Example materials for row lines 104 and column lines 106 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $TiSi_3$, $TaSi_2$, $WSi_2$, $NbSi_2$, $V_3Si$, electrically doped polycrystalline Si, electrically doped polycrystalline Ge, and combinations thereof. In the example of FIG. 1, crossbar array 105 may have N row lines and M column lines.

Memory cells 106A-106I may be coupled between row lines 104 and column lines 106 at intersections of the row lines 104 and column lines 106. For example, memory cells 106A-106I may be positioned to calculate a new node values of an input vector of node values with respect to a weight matrix. Each of the memory cells 106A-106I may have a memory device such as a resistive memory element, a capacitive memory element, or some other form of memory.

In some examples, each of the memory cells 106A-106I may include a resistive memory element. A resistive memory element may have a resistance that changes with an applied voltage or current. Furthermore, in some examples, the resistive memory element may "memorize" its last resistance, either in a volatile or a non-volatile way. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of hardware accelerator 100. In some examples, memory cells 106A-106I may include other components, such as access transistors or selectors. For example, each of the memory cells 106A-106I may be coupled to an access transistor between the intersections of a row line 104 and a column line 106. Access transistors may facilitate the targeting of individual or groups of memory cells 106A-106I for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector may be coupled to each of the memory cells 106A-106I to facilitate the targeting of individual or groups of memory cells 106A-106I. For example, a selector may do so by acting like an on-off switch, and it may mitigate sneak current disturbance.

The memory cells 106A-106I of memristor crossbar array 105 may be programmed according to a weight matrix of a neural network. A weight matrix may represent a compilation of operations of a neural network. For example, a weight matrix may represent the weighted edges of HNN illustrated in FIG. 4. The value stored in the memory cells 106A-106I may represent the values of a weight matrix. In implementations of resistive memory, the resistance levels of each of the memory cells 106A-106I may represent a value of the weight matrix. In such a manner, the weight matrix may be mapped onto crossbar array 105.

Memory cells 106A-106I may be programmed, for example, by having programming signals driven through them, which drives a change in the state of the memory cells 106A-106I. The programming signals may define a number of values to be applied to the memory cells 106A-106I. As described herein, the values of memory cells 106A-106I of crossbar array 105 may represent a weight matrix of a neural network, such as an HNN.

In continuing reference to FIG. 1, hardware accelerator 100 may receive an input vector of node values at the plurality of row lines 104. The input vector may include node values which are to be evolved into next input values for the neural network. The input vector node values may be converted to input voltages ($V^r$) 103 by a drive circuit, drivers 135. A drive circuit 135 may deliver a set of input voltages that represents the input vector to the memristor crossbar array 105. In some examples, the voltages 103 may be other forms of electrical stimulus such as an electrical current driven to the memory cells 106A-106I. Furthermore, in some examples, the input vector may include digital values, which may be converted to analog values of the input electrical signals by a digital-to-analog converter. In other examples, the input vector may already include analog values.

Upon passing through the memristor crossbar array 105, the plurality of column lines 107 may deliver output currents ($I^o$) 109, where the output currents 109 may be compared to a threshold current according to an update rule to generate a new input vector of new node values. According to the embodiments, the thresholding aspects of the circuit's function are adapted in order to apply the disclosed hardware-based annealing techniques by harnessing noise. Details of these operations is described in below.

Hardware accelerator 100 may also include other peripheral circuitry associated with crossbar array 105. The drivers 135, may for a selected row line 104, can drive a corresponding row line 104 with different voltages corresponding to a neural network or the process of setting resistance values within memory cells 106A-106I of memristor crossbar array 105. Similar drive and decode circuitry may be included for column lines 107. Control circuitry may also be used to control application of voltages at the inputs and reading of voltages at the outputs of hardware accelerator 100. Digital to analog circuitry and analog to digital circuitry may be used for input voltages 103 and the output currents 109. In some examples, the peripheral circuitry above described can be fabricated using semiconductor processing techniques in the same integrated structure or semiconductor die as crossbar array.

As described herein, there are three main operations that occur during operation of the hardware accelerator 100. The first operation is to program the memory cells 106A-106I in the memristor crossbar array 105 so as to map the mathematical values in an N×M weight matrix to the array. In some examples, N and M may be the same number, and the weight matrix is symmetrical. In some examples, each of the memory cells 106A-106I are programmed at a time during the programming operation. The second operation is to calculate an output current by the dot-product of input voltage and the resistance values of the memory cells of a column line 107. In this operation, input voltages are applied, and output currents obtained, corresponding to the result of multiplying an N×M matrix by an N×1 vector. In some examples, the input voltages are below the programming voltages so the resistance values of the memory cells 106A-106I, such as resistive memory, are not changed during the linear transformation calculation. The third operation is to compare the output currents with a threshold current. For example, comparators 120 may compare the output currents with the threshold current to determine a new input vector of new node values.

In an example, hardware accelerator 100 may calculate node values by applying a set of voltages ($V^I$) 103 simultaneously along row lines 104 of the N×M crossbar array 105 and collecting the currents through column lines 107 and generating new node values. On each column line 107, every input voltage 103 is weighted by the corresponding memristance ($1/G_{ij}$) and the weighted summation is reflected at the output current. Using Ohm's law, the relation between the input voltages 103 and the output currents can be represented by a vector-matrix multiplication of the form: $\{V^O\}T=-\{V^I\}^T[G]$ Rs, where $G_{ij}$ is an N×M matrix determined by the conductance (inverse of resistance) of memristor crossbar array 105, Rs is the resistance value of the sense amplifiers and T denotes the transpose of the column vectors $V^O$ and $V^I$. The negative sign follows from use of a negative feedback operational amplifier in the sense amplifiers. From the foregoing, it follows that the hardware accelerator 100 can be utilized for multiplying a first vector of values $\{b_i\}^T$ by a matrix of values $[a_{ij}]$ to obtain a second vector of values $\{c_j\}^T$, where i=1,N and j=1,M. The vector operation can be set forth in more detail as follows:

$$a_{11}b_1+a_{21}b_2+\ldots+a_{N1}b_N=c_1$$

$$a_{1M}b_1+a_2b_2+\ldots+a_{NM}b_N=c_M \quad (3)$$

The vector processing or multiplication using the principles described herein generally starts by mapping a matrix of values $[a_{ij}]$ onto crossbar array 105 or, stated otherwise, programming (e.g., writing) conductance values $G_{ij}$ into the crossbar junctions of the memristor crossbar array 105.

With reference still to FIG. 1, in some examples, each of the conductance values $G_{ij}$ may be set by sequentially imposing a voltage drop over each of the memory cells 106A-106I. For example, the conductance value $G_{2,3}$ may be set by applying a voltage equal to $V_{Row2}$ at the second row line 104 of memristor crossbar array 105 and a voltage equal to $V_{Col3}$ at the third column line 107 of the array 105. The voltage input, $V_{Row2}$, may be applied to the second row line occurring at the second row line adjacent the j=1 column line. The voltage input, $V_{Col3}$, will be applied to the third column line adjacent either the i=1 or i=N location. Note that when applying a voltage at a column line 107, the sense circuitry for that column line may be switched out and a voltage driver switched in. The voltage difference $V_{Row2}-V_{Col3}$ will generally determine the resulting conductance value $G_{2,3}$ based on the characteristics of the memory cell 106f located at the intersection. When following this approach, the unselected column lines 107 and row lines 104 may be addressed according to one of several schemes, including, for example, floating all unselected column lines 107 and row lines 104 or grounding all unselected column lines and row lines. Other schemes involve grounding column lines 107 or grounding partial column lines 107. Grounding all unselected column lines and row lines is beneficial in that the scheme helps to isolate the unselected column lines and row lines to minimize the sneak path currents to the selected column line 107.

In accordance with examples herein, memristors used in memory cells 106A-106I may have a linear current-voltage relation. Linear current-voltage relations permit higher accuracy in the matrix multiplication process. However, memristor crossbar array 105 having linear memristors are prone to having large sneak path currents during programming of the array 105, particularly when the size of memristor crossbar array 105 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Following programming, operation of linear transformation accelerator 100 proceeds by applying the input voltages 110 and comparing the output currents to threshold currents. The output current delivered from column lines 106 may be compared, by current comparator 116, with a threshold current. Current comparator 116 may be a circuit or device that compares two currents (i.e., output current and threshold current) and outputs a digital signal indicating which is larger. Current comparator 116 may have two analog input terminals and one binary digital output.

Figure 2A:
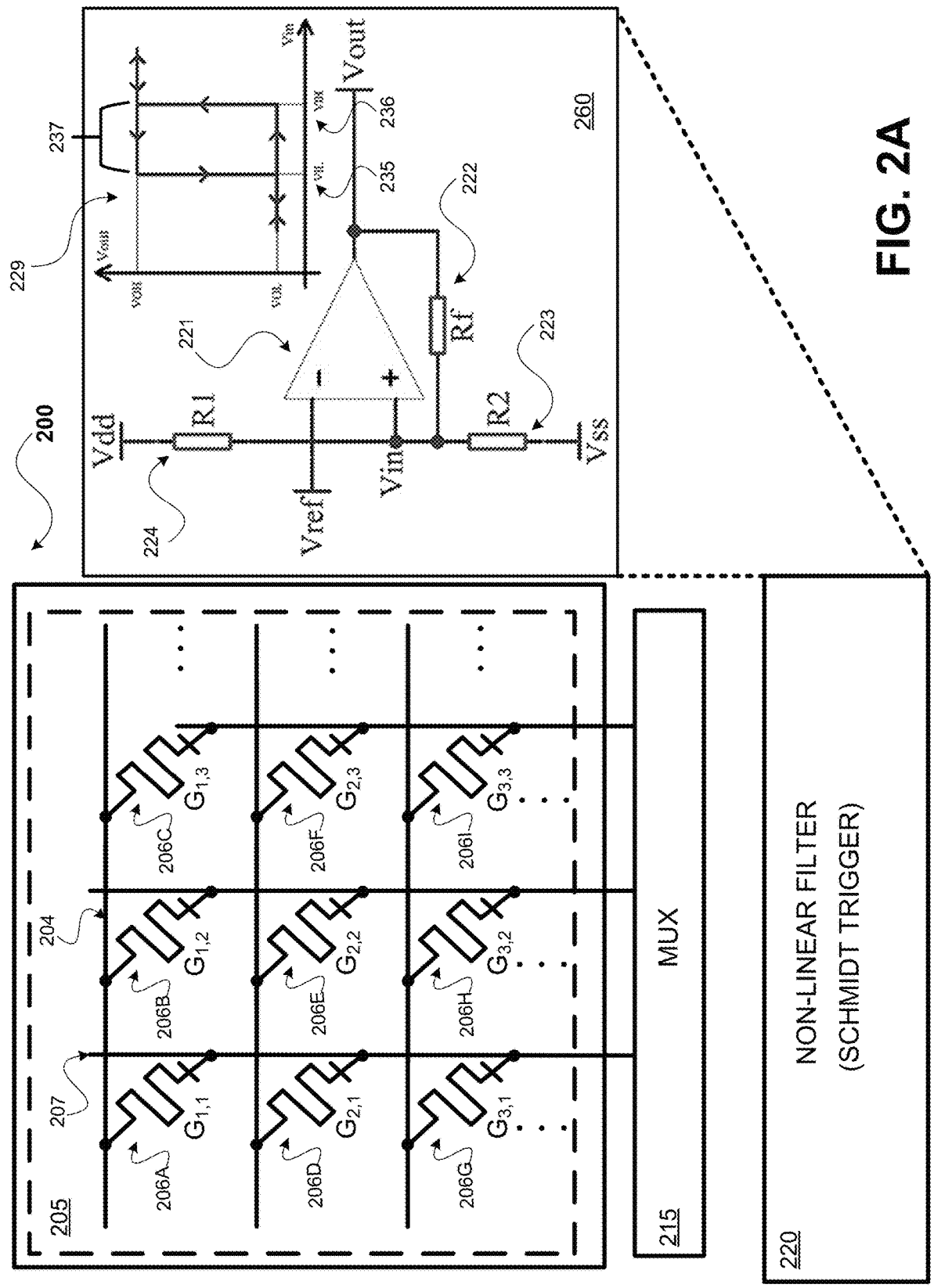
FIG. 2A illustrates an example of a circuit configuration including a memristor crossbar array for implementing a weight matrix of a neural network and the non-linear filter including a Schmidt trigger circuit for harnessing noise of the emulated neural network shown in FIG. 1, according to some embodiments.

Additionally, FIG. 1 shows that the hardware accelerator 100 can include a non-linear filter 120. According to the embodiments, non-linear filter 120 is particularly designed to leverage noise in the analog circuitry. For instance, noise that may be intrinsically generated by the crossbar array 105, can be used in manner that implements the simulated annealing aspects described above. In the illustrated example of FIG. 1, the non-linear filter 120 can be coupled to the crossbar array 105, such as being included in the peripheral circuitry of the hardware accelerator 100. FIG. 2A shows an example of a circuit configuration for the hardware accelerator 200 comprising the memristor crossbar array structure 205, and prominently illustrating a configuration for the non-linear filter 220. In the example of FIG. 2A, the non-linear filter 220 can be implemented as a Schmidt trigger 260.

In the configuration of FIG. 2A, the Schmidt trigger 260 handles noise that may be present in the circuit during the computations of the emulated neural network. Utilizing a Schmidt trigger 260 in the hardware design not only reduces the impact of noise on computations, but can improve efficiency and/or accuracy of these computations in the presence of high levels of noise, which favors implementing a larger crossbar array 205. As alluded to above, larger crossbar arrays can provide comparatively increased computational capabilities than a hardware accelerator using smaller cross bar arrays. A Schmidt trigger 260 can be implemented using relatively simple circuitry. As seen in FIG. 2A, an example Schmidt trigger circuit 260 can include resistors 222, 223, 224 and operational amplifier (op-amp)

221. Thus, a performance enhancing solution can be implemented using minimal adaptations to the peripheral circuitry of the hardware accelerator 200. The Schmidt trigger 260 can be generally described to function as causing a threshold to be direction-dependent, adding resistance to change (or inertia). For example, the Schmidt trigger 260 can be included in the portion of the circuit where comparisons are performed in the computation. A comparator in the hardware accelerator 200 may be used to determine a new node value for the emulated HNN. The new node values may be aggregated to generate a new input vector. For example, each output current may be compared by an update rule. A new node value corresponding to a particular output current can be set to a first value if the particular output current is greater than or equal to the threshold current, $\Theta_i$. The new node value can be set to a second value if the particular output current is less than the threshold current. Each output current may be represented as the sum of the products of an input vector with the weight matrix. For example, the update rule may be represented as the equation that follows:

$$s_i = \begin{matrix} +1 & \text{if } \sum_j w_{ij} s_j \geq \theta_i \\ -1 & \text{otherwise} \end{matrix} \quad (4)$$

Referring back to FIG. 1, the node values may also be programmed to attain values of +1 or 0, rather than +1 and −1 in the above equation. Any other pair of values may also be used. In some examples, the threshold currents may be delivered to the current comparators 116 via circuitry independent from crossbar array 102. Furthermore, in some examples, column lines 107 may have different threshold currents associated with it. This is further described below. Alternatively, each column line 106 may be associated with a same threshold current.

In the example shown in FIG. 2A, the Schmidt trigger 260 can function as a comparator. As a general description, a Schmidt trigger 260 can be comparator circuit that applies positive feedback to a non-inverting input such that the output retains its value until the input changes sufficiently to further trigger a change in the output. Applying the Schmidt trigger 260 where thresholding is performed in the circuit, thereby causes the threshold to be state dependent. As a result, the Schmidt trigger 260 can allow values to be computed, without noise compromising the computational result. This capability to "hold" a computational result, making it more resistant to change (e.g., an unintended impact of noise) can be associated with a width that corresponds to the signaling of a Schmidt trigger 260.

An example of a width 237 associated with the Schmidt trigger 260 is illustrated graph 229 which visually represents the trigger's transfer function. The horizontal axis of graph 229 can be input voltage (e.g., Vin), and the vertical axis can be output voltage (e.g., Vout). As such, a low voltage input limit 235 (e.g., VIL) and a high voltage input limit 236 (e.g., VIH) can represent the switching thresholds. A width 237 for the Schmidt trigger 260, may be represented graphically as the difference between the lower limit and upper limit of the trigger, VIL 235 and VIH 236 respectively. A general description of the relationship between the width 237 of the Schmidt trigger 260 and the noise tolerance is as follows: a larger width 237 translates to more tolerance to an amount of noise that is needed for triggering a change to the output, which is the circuit allowing noise to have little impact on the computational values (e.g., more analog noise filtered); and a smaller width 327 allows for less tolerance to an amount of noise needed for triggering a change to the output, which is the circuit allowing for noise to have a greater impact on the computational values (e.g., less noise filtered out). For example, the simulated annealing techniques may be implemented by the Schmidt trigger 260 by initially having its width 237 set to a lowest limit value, for example zero (e.g., W=0). Accordingly, any noise in the circuitry, for example noise from the analog crossbar array 205, is permitted to substantially impact the computational values, which simulates leveraging noise for excitation out of local minima for the neural network. Therefore, in cases where intrinsic noise in the hardware accelerator 200 is greater than an optimal noise for convergence of the emulated neural network, the resulting computations can be improved. In some embodiments, the Schmidt trigger 260 is particularly configured to allow the amount of noise that impacts the computational results to be equal (or greater than) a determined optimal noise value associated with the neural network emulated by the hardware (e.g., optimal noise value may represent a noise level used in simulated annealing that may generate the most accurate calculations for an HNN).

Furthermore, Schmidt trigger 260 is configured such that the width 237 can dynamically change as a function of time (or a function of number of computations). For instance, width 237 for the Schmidt trigger 260 may be initially set to zero, and then gradually increases over time, allowing less analog noise to impact the computational result. As such, the Schmidt trigger 260 can simulate annealing techniques described above, where more noise is introduced into the system, in order to provide enough excitation for the neural network to escape local minima. Then, the amount of noise gradually tapers off, allowing the neural network to converge at global minima. Similarly, the Schmidt trigger 260 ramps up its width 237 to increase the associated noise tolerance, thereby reducing the impact of noise on the circuit's computational results. According to the embodiments, width 237 can serve as a dynamic parameter that can be tuned for the purposes of harnessing noise to enhance the hardware accelerator 200. In most cases, the width 237 implemented is a design objective that is specific to the application of the hardware accelerator 200. For purposes of illustration, width 237 can be set at any desirable value between a lower limit of zero (W=0) for full noise tolerance, and an upper limit of one (W=1) for substantially no noise tolerance, which can be described as the width 237 spanning the maximum input voltage size. For example, a Schmidt trigger 260 can introduce an element into computations of an HNN that may be represented as the equation below:

$$u_i = \sum_{j \neq i} W_{ij} v_j, \; v_i = \begin{cases} +1 \text{ if } (u_i + n_i) \geq \theta_i \\ -1 \text{ if } (u_i + n_i) < \theta_i \end{cases} \quad (5)$$

Accordingly, based on the application of equation (5), the Schmidt trigger 260 in FIG. 2A is configured to implement a history dependence on $\Theta_i$.

Figure 2B:
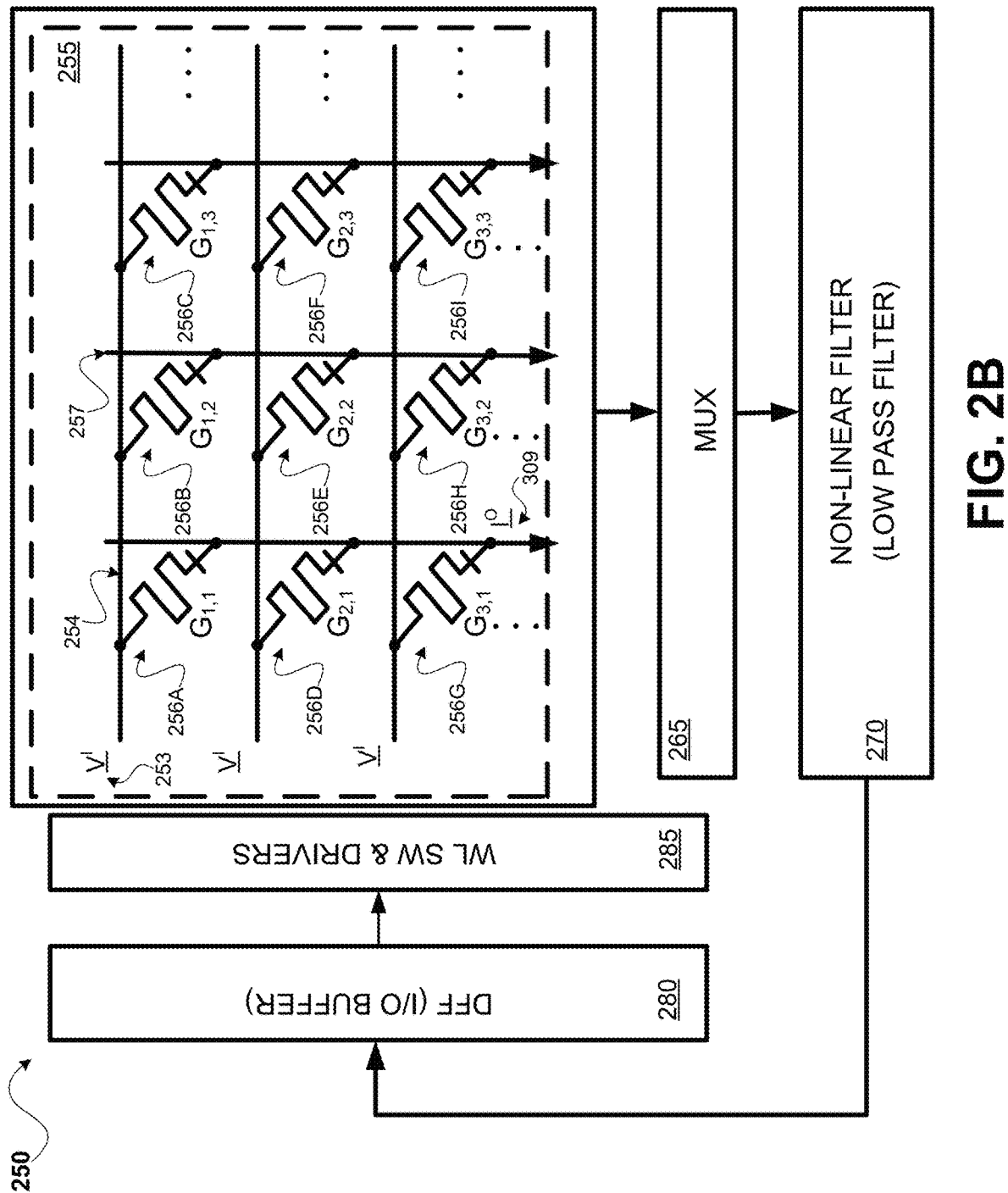
FIG. 2B illustrates another example of a circuit configuration including a memristor crossbar array for implementing a weight matrix of a neural network and the non-linear filter including a low-pass filter circuit for harnessing noise of the emulated neural network, according to some embodiments.

Referring now to FIG. 2B, an alternate configuration for a non-linear filter 270 used for harnessing analog noise is shown. In the example of FIG. 2B the non-linear filter 270 is implemented as a low-pass filter. The non-linear filter 270 functions in a manner that is substantially similar to the non-linear filter of FIG. 2A. In other words, a low pass filter 270 implementation can be configured to increasingly filter out more of the noise from impacting the computational results, as a function of time. Therefore, more noise is initially allowed to impact the circuit's computations vis-à-vis the low pass filter 270. Thereafter, the non-linear filter 270 begins to gradually filter out more of the analog noise. Consequently, a hardware-driven implementation can simulate the abovementioned annealing techniques.

It should be appreciated that various types of low pass filters 270 may be used to implement the non-linear filter 270 in FIG. 2B. In an example, the low pass filter 270 can have a circuit configuration that includes a capacitor, which is added to a feedback path of an op-amp. The circuitry is configured for the low pass filter 270 to act as a history integrator, performing low pass filtering of noise. Thus, the example illustrated in FIG. 2B also employs a relatively simple adaption to the peripheral circuitry to realize noise harnessing. It should be understood that the examples of FIGS. 2A-2B are for purposes of discussion, and the disclosed hardware accelerator 250, and the components therein, can be arranged in various other circuit configurations as deemed appropriate and/or necessary.

Referring back to FIG. 2B, the function of the low pass filter 270, the memristor crossbar array 255 can generate noise that is permitted to impact its output, thereby simulating annealing to improve performance. Furthermore, as the hardware accelerator 250 is more robust and resilient to extra noise in the system, the variance in solution quality is also improved. Also, by provisioning for a larger crossbar array 255 to be implemented, the noise harnessing techniques improve power-efficiency used in computing complex optimization problems. For example, a low pass filter 270 can introduce an element into computations of an HNN that may be represented as the equation below:

$$u_i(t) \leftarrow u_i(t)*\alpha + u_i(t-1)*(1-\alpha) \quad (6)$$

where α is between 0 and 1 (typically close to 1)

Based on the application of equation (6), the low pass filter 270 is configured to have a smoothing effect on $u_i$ (e.g., low pass filtering), which effectively handles excessive noise in the hardware accelerator 250.

As the low pass filter 270 harnesses noise to impact computations of the HNN, delivery of the new input vector of new node values, can cause a controller to determine whether the new node values are final node values of the HNN. For example, the emulated neural network may be modeled to determine a minimum energy of a system. In such an example, a controller can determine whether the new node values, which here represents an energy of the system, are a local minimum of the system. In response to a controller determining that the new node values are not final node values, the new input vector can be converted to input voltages to be delivered to the plurality of row lines of the crossbar array 105. In such a manner, the hardware accelerator 250 can be recurrent to calculate an iterative problem, such as determining a minimum energy of a system, implementing an HNN as hardware. Furthermore, the hardware accelerator 250, incorporating the noise harnessing techniques disclosed herein, can improve its computations used for solving optimization problems. As an example, the noise harnessing techniques may improve the success probability of the computed solutions of a hardware accelerator from ~30% (without noise harnessing) to ~55% (including noise harnessing).

In some cases, the hardware accelerator 100 can be implemented as an engine in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein. Although the embodiments are described in reference to HNNs for purposes of discussion, it should be appreciated that the noise harness techniques can be similarly applied to other recurrent neural networks, such as Boltzmann techniques, and the like. Even further, the embodiments are not intended to be limited to memristor crossbar arrays, but can be applicable to other arrays (e.g., composed of various forms of analog cells) that perform analog computations, such as phase-changing memory (PCM), oxide memristors, Flash cells, magnetoresistive random access memory (MRAM), and the like.

Figure 5:
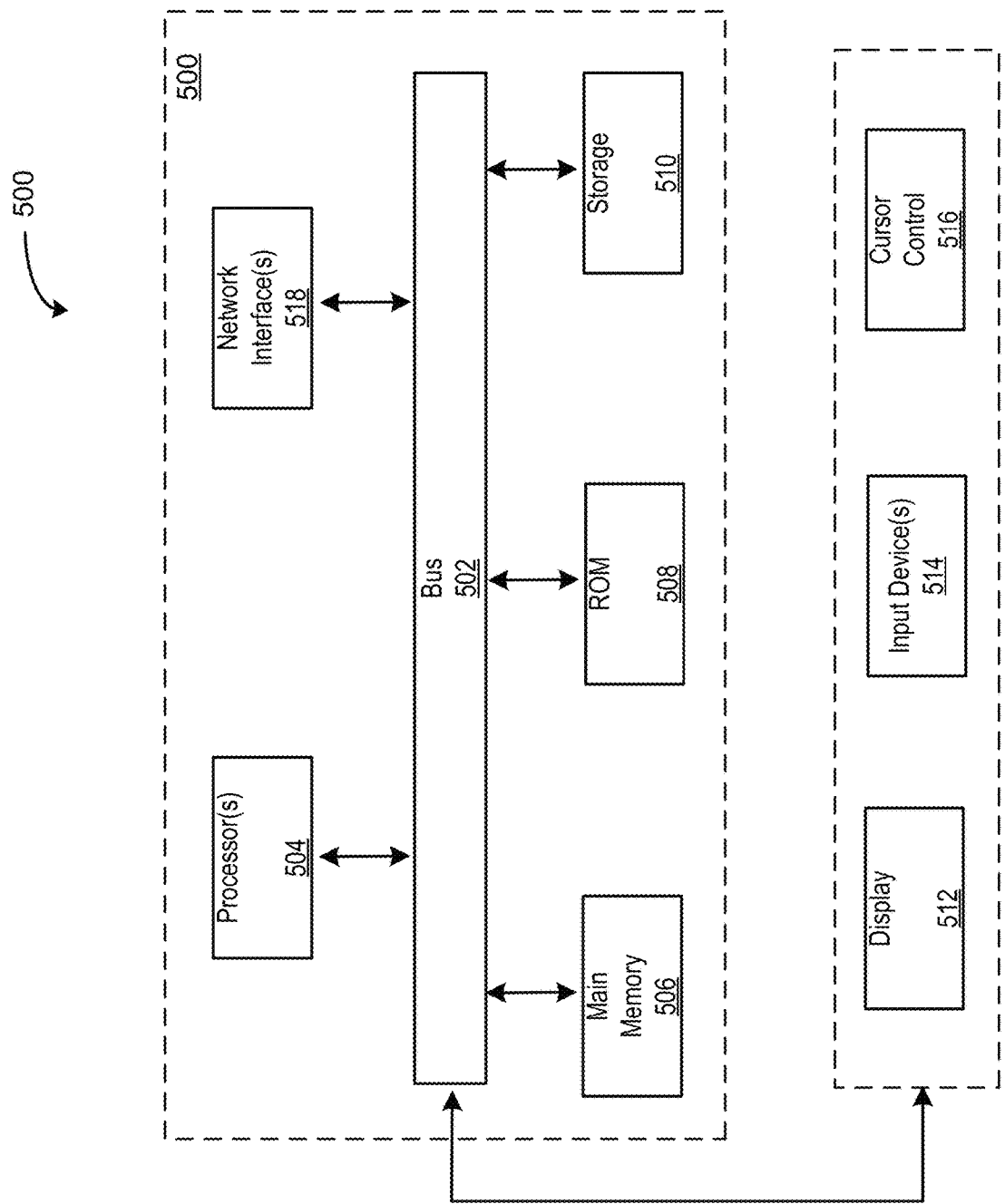
FIG. 5 illustrates an example computer system that may include the hardware accelerator emulating a neural network shown in FIG. 1, according to some embodiments.

FIG. 5 depicts a block diagram of an example computer system 500 in which the hardware accelerator and/or the noise harnessing techniques of the embodiments described herein may be implemented. The computer system 500 includes a bus 502 or other communication mechanism for communicating information, and one or more hardware processors 504 coupled with bus 502 for processing information. Hardware processor(s) 504 may be, for example, one or more general purpose microprocessors.

The computer system 500 also includes a main memory 506, such as a random-access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions. The description of the functionality provided by the different instructions described herein is for illustrative purposes, and is not intended to be limiting, as any of instructions may provide more or less functionality than is described. For example, one or more of the instructions may be eliminated, and some or all of its functionality may be provided by other ones of the instructions. As another example, processor 504 may be programmed by one or more additional instructions that may perform some or all of the functionality attributed herein to one of the instructions.

The computer system 500 further includes storage device 510. The various instructions described herein, including the ADC list concatenation techniques, may be stored in a storage device 510, which may comprise read only memory (ROM), and/or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions. The storage device 510 may store the computer program instructions (e.g., the aforementioned instructions) to be executed by processor 504 as well as data that may be manipulated by processor 504. The storage device may comprise one or more non-transitory machine-readable storage media such as floppy disks, hard disks, optical disks, tapes, or other physical storage media for storing computer-executable instructions and/or data.

The computer system 500 may be coupled via bus 502 to a display 512, such as a liquid crystal display (LCD) (or touch screen), for displaying information to a computer user. An input device 514, including alphanumeric and other keys, is coupled to bus 502 for communicating information and command selections to processor 504. Another type of user input device is cursor control 616, such as a mouse, a trackball, or cursor direction keys for communicating direction information and command selections to processor 504 and for controlling cursor movement on display 512. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 508. Such instructions may be read into main memory 508 from another storage medium, such as storage device 510. Execution of the sequences of instructions contained in main memory 508 causes processor(s) 504 to perform the process steps described herein. In alternative embodiments, hard-wired circuitry may be used in place of or in combination with software instructions.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit, comprising:
    an array of analog elements programmed to calculate node values of a neural network, wherein the nodes values are output by the array of analog elements and calculated in accordance with rules to reduce an energy function associated with the neural network; and
    a circuit element coupled to the array of analog elements, the circuit element programmed to permit a noise signal to effect the calculated node values such that the energy function associated with the neural network converges towards a global minimum and modifies the calculated node values output by the array of analog elements, wherein the circuit element comprises at least one of: a Schmidt trigger comparator and a low pass filter.

2. The circuit of claim 1, wherein the Schmidt trigger comparator is programmed to permit the noise signal to effect the calculated node values output by the array of analog elements in accordance with a tolerance to an amount of the noise signal for triggering a modification to the calculated node values.

3. The circuit of claim 2, wherein the Schmidt trigger comparator is programmed to permit the noise signals to effect the calculated node values output by the array of analog elements such that the noise signals are greater than an optimal noise value associated with the neural network.

4. The circuit of claim 3, wherein the Schmidt trigger comparator is programmed to dynamically adjust the tolerance to an amount of the noise signal for triggering a modification to the calculated node values output by the array of analog elements as a function of time.

5. The circuit of claim 4, wherein the Schmidt trigger comparator is programmed to gradually increase the tolerance to an amount of the noise signal for triggering a modification to the calculated node values output by the array of analog elements as a function of increasing time.

6. The circuit of claim 5, wherein the Schmidt trigger comparator is programmed to dynamically adjust the tolerance to an amount of the noise signal for triggering a modification to the calculated node values output by the array of analog elements by adjusting a width between an upper trigger limit and a lower trigger limit.

7. The circuit of claim 1, wherein the noise signal comprises a noise signal intrinsically generated by the array of analog elements.

8. The circuit of claim 1, wherein the low pass filter is programmed to permit the noise signal to effect the calculated node values output by the array of analog elements in accordance with an amount of the noise signal that is filtered.

9. The circuit of claim 8, wherein the low pass filter is programmed to dynamically adjust the amount of the noise signal that is filtered as a function of time.

10. The circuit of claim 1, wherein the array of array of analog elements comprises one of: a memristor crossbar array, a memristor bipolar array, phase-change memory (PCM), Flash cells, and magnetoresistive random access memory (MRAM).

11. The circuit of claim 1, wherein the modified node values are updated in accordance with an update rule to generate new inputs values into the neural network for a calculation of new node values.

12. The circuit of claim 11, comprising a controller is programmed to:
determine whether the new node values are final node values of the neural network; and
in response to determining that the new node values are not final node values, mapping the new input values to input voltages to be received as input by the array of analog elements.

13. The circuit of claim 12, where the controller is further programmed to:
in response to determining that the new node values are the final node values, the new node values correspond to a solution of a computational problem mapped to the neural network.

14. The circuit of claim 1, wherein the neural network comprises a Hopfield Neural Network (HNN).

15. A hardware accelerator, comprising:
a memristor crossbar array programmed to calculate node values of a neural network, wherein the nodes values are output by the memristor crossbar array and calculated in accordance with rules to reduce an energy function associated with the neural network; and
a non-linear filter coupled to the memristor crossbar array programmed to permit a noise signal to effect the calculated node values such that the energy function associated with the neural network converges towards a global minimum and modifies the calculated node values output by the memristor crossbar array, wherein the non-linear filter comprises at least one of: a Schmidt trigger comparator and a low pass filter.

16. The hardware accelerator of claim 15, wherein the Schmidt trigger comparator is programmed to permit the noise signal to effect the calculated node values output by the memristor crossbar array in accordance with a tolerance to an amount of the noise signal for triggering a modification to the calculated node values.

17. The hardware accelerator of claim 16, wherein the Schmidt trigger comparator is programmed to dynamically adjust the tolerance to an amount of the noise signal for triggering a modification to the calculated node values output by the memristor crossbar array as a function of time.

18. The hardware accelerator of claim 15, wherein the low pass filter is programmed to permit the noise signal to effect the calculated node values output by the array of analog elements in accordance with an amount of the noise signal that is filtered.

19. The hardware accelerator of claim 15, wherein the noise signal comprises a noise signal intrinsically generated by the memristor crossbar array.

20. The hardware accelerator claim 15, wherein the memristor crossbar array comprises:
a plurality of weight row lines;
a plurality of weight column lines; and
a plurality of memory cells, wherein each of the plurality of memory cells are coupled across an intersection of one of the plurality of weight row lines and one of the plurality of weight column lines and programmed according to a weight matrix to output the calculated node value of the neural network across each of the plurality of weight column lines.

* * * * *